(12) United States Patent
Richardson et al.

(10) Patent No.: US 7,906,905 B2
(45) Date of Patent: Mar. 15, 2011

(54) ORGANIC OPTOELECTRICAL DEVICE COMPRISING A METALLIC SEAL AND METHOD OF FABRICATION OF AN ORGANIC OPTOELECTRONIC DEVICE

(75) Inventors: Martin Richardson, Cambs (GB); Haydn Gregory, San Jose, CA (US)

(73) Assignee: Cambridge Display Technology Limited, Cambridgeshire (GB)

( * ) Notice: Subject to any disclaimer, the term of this patent is extended or adjusted under 35 U.S.C. 154(b) by 878 days.

(21) Appl. No.: 11/598,503

(22) Filed: Nov. 13, 2006

(65) Prior Publication Data
US 2007/0182324 A1 Aug. 9, 2007

(30) Foreign Application Priority Data
Nov. 14, 2005 (GB) .................................. 0523159.2

(51) Int. Cl.
H01L 51/50 (2006.01)
H01L 51/52 (2006.01)
H01L 51/54 (2006.01)
H01L 51/56 (2006.01)

(52) U.S. Cl. ........... 313/512; 313/509; 313/506; 445/25
(58) Field of Classification Search .......... 313/498–512; 445/24–25
See application file for complete search history.

(56) References Cited

U.S. PATENT DOCUMENTS

| | | | |
|---|---|---|---|
| 4,539,507 A | 9/1985 | VanSlyke et al. | |
| 6,268,695 B1 | 7/2001 | Affinito | |
| 7,109,653 B2 * | 9/2006 | Imamura | 313/512 |
| 7,242,375 B2 * | 7/2007 | Hayashi et al. | 345/76 |
| 7,473,928 B1 * | 1/2009 | Yamazaki et al. | 257/72 |
| 2004/0189194 A1 | 9/2004 | Kihara et al. | |
| 2005/0030258 A1 * | 2/2005 | Satake | 345/55 |
| 2005/0045891 A1 * | 3/2005 | Yamazaki et al. | 257/72 |
| 2005/0174043 A1 | 8/2005 | Kiguchi et al. | |
| 2005/0189878 A1 | 9/2005 | Shitagami et al. | |

(Continued)

FOREIGN PATENT DOCUMENTS

| | | |
|---|---|---|
| EP | 0 949 850 A1 | 10/1999 |
| EP | 0 989 778 A1 | 3/2000 |
| GB | 0402559.9 | 8/2005 |
| WO | WO-90/13148 A1 | 11/1990 |

(Continued)

OTHER PUBLICATIONS

Combined Search and Examination Report for United Kingdom Application No. 0523159.2, dated Mar. 9, 2006.

*Primary Examiner* — Nimeshkumar D Patel
*Assistant Examiner* — Jose M Diaz
(74) *Attorney, Agent, or Firm* — Marshall, Gerstein & Borun LLP (57) ABSTRACT

An organic optoelectrical device comprising: a substrate; at least one first electrode disposed over the substrate; a layer of bank material disposed over the first electrode and defining a plurality of wells; a layer of organic semi-conductive material disposed in the wells; at least one second electrode disposed over the layer of organic semi-conductive material in the wells; an encapsulant disposed over the at least one second electrode; a layer of the bank material provided at a periphery of the device; and a metallic seal adhering the encapsulant to the layer of bank material at the periphery of the device, the bank material being an inorganic electrically insulating material whereby the substrate, the bank material, the metallic seal and the encapsulant form a seal at the periphery of the device.

37 Claims, 5 Drawing Sheets

U.S. PATENT DOCUMENTS

| | | | |
|---|---|---|---|
| 2005/0231107 A1* | 10/2005 | Yamazaki et al. | 313/506 |
| 2005/0264182 A1* | 12/2005 | Seki | 313/503 |
| 2005/0264866 A1* | 12/2005 | Ohtaka et al. | 359/290 |
| 2006/0158111 A1* | 7/2006 | Hayashi | 313/512 |
| 2006/0292774 A1* | 12/2006 | Chen et al. | 438/197 |
| 2007/0003743 A1* | 1/2007 | Asano et al. | 428/201 |
| 2008/0278064 A1* | 11/2008 | Kumaki et al. | 313/504 |

FOREIGN PATENT DOCUMENTS

| | | |
|---|---|---|
| WO | WO-01/19142 A1 | 3/2001 |
| WO | WO-01/81649 A1 | 11/2001 |
| WO | WO-03/065474 A1 | 8/2003 |
| WO | WO-03/083960 A1 | 10/2003 |
| WO | WO-2005/076386 A1 | 8/2005 |

\* cited by examiner

LIGHT EMISSION

ORGANIC OPTOELECTRICAL DEVICE COMPRISING A METALLIC SEAL AND METHOD OF FABRICATION OF AN ORGANIC OPTOELECTRONIC DEVICE

BACKGROUND OF THE INVENTION

1. Field of the Invention

The present invention relates to an organic optoelectrical device and a method of manufacture thereof.

2. Related Technology

One class of optoelectrical devices uses organic material for light emission (or detection in the case of photovoltaic cells and the like). The basic structure of these devices comprises a light emissive organic layer, for instance a film of a poly(p-phenylene vinylene) ("PPV") or polyfluorene, sandwiched between a cathode for injecting negative charge carriers (or electrons) and an anode for injecting positive charge carriers (holes) into the organic layer. The electrons and holes combine in the organic layer generating photons. In WO 90/13148 the organic light emissive material is a polymer. In U.S. Pat. No. 4,539,507 the organic light emissive material is of the class known as small molecule materials, such as (8-hydroxyquinolene) aluminum ("ALq3"). In a practical device one of the electrodes is transparent, to allow the photons to escape the device.

Typically, the above-described devices comprise: a substrate; a first electrode disposed over the substrate for injecting charge of a first polarity; a second electrode disposed over the first electrode for injecting charge of a second polarity opposite to said first polarity; an organic light emitting layer disposed between the first and the second electrodes; and an encapsulant disposed over the second electrode. In one arrangement, the substrate and the first electrode are transparent to allow light emitted by the organic light emitting layer to pass therethrough. In another arrangement, the second electrode and the encapsulant are transparent so as to allow light emitted from the light emitting layer to pass therethrough.

Variations of the above-described structures are known. The first electrode may be the anode and the second electrode may be the cathode. Alternatively, the first electrode may be the cathode and the second electrode may be the anode. Further layers may be provided between the electrodes and the organic light emitting layer in order to improve charge injection and transport. The organic material in the light emitting layer may comprise a small molecule, a dendrimer or a polymer and may comprise phosphorescent moieties and/or fluorescent moieties. The light emitting layer may comprise a blend of materials including light emitting moieties, electron transport moieties and hole transport moieties. These may be provided in a single molecule or on separate molecules.

By providing an array of devices of the type described above, a display may be formed comprising a plurality of emitting pixels. The pixels may be of the same type to form a monochrome display or they may be different colors to form a multicolor display.

To control the pixels, and so form the image required, either "passive" or "active" matrix driver methods are used.

Active matrix displays incorporate a transistor (TFT) in series with each pixel which provides control over the current and hence the brightness of individual pixels. Lower currents can flow down a control wire since these have only to program the TFT driver, and the wires can be fine as a result. Also, the transistor is able to hold at the current setting, keeping the pixel at the required brightness, until it receives another control signal. DC drive conditions typically are used for an active matrix display.

In passive matrix systems, the matrix is rapidly scanned to enable every pixel to be switched on or off as required. The controlling current has to be present whenever the pixel is required to light up.

In order to form the pixels, a bank layer is deposited over the first electrodes and patterned by, for example, standard photolithographic techniques, in order to define wells in which the organic emitting material can be deposited. The material used for the bank layer is usually an organic material such as a polyimide. Additionally, cathode separators may be formed on the blank structure, e.g. resist, polyimide.

Figure 1:
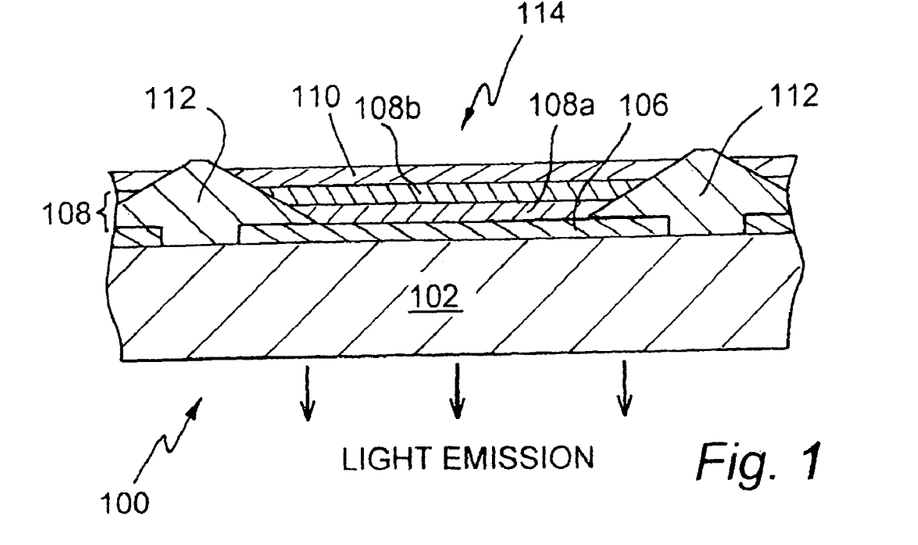
FIG. 1 shows a vertical cross section through an example of an OLED device.

FIG. 1 shows a vertical cross-section through an example of an organic light-emitting diode (OLED) device. The structure of the device is somewhat simplified for the purposes of illustration.

An OLED 100 comprises a substrate 102, typically 0.7 mm to 1.1 mm glass but optionally clear plastic, on which an anode layer 106 has been deposited. The anode layer typically comprises around 150 nm thickness of ITO (indium tin oxide), over which is provided a metal contact layer, typically around 500 nm of aluminum, sometimes referred to as anode metal. Glass substrates coated with ITO and contact metal may be purchased from Corning, USA. The contact metal (and optionally the ITO) is patterned as desired so that it does not obscure the display, by a conventional process of photolithography followed by etching.

A substantially transparent hole transport layer 108a is provided over the anode metal, followed by an electroluminescent layer 108b. Banks 112 may be formed on the substrate, for example from positive or negative photoresistant material, to define wells 114 into which these active organic layers may be selectively deposited, for example by a droplet deposition or inkjet printing techniques. The wells thus define light emitting areas or pixels of the displays.

A cathode layer 110 is then applied by, for example, physical vapor deposition. The cathode layer typically comprises a low work function metal such as calcium or barium covered with a thicker, capping layer of aluminum and optionally including an additional layer immediately adjacent the electroluminescent layer, such as a layer of lithium fluoride, for improved electron energy level matching. Mutual electrical isolation of cathode lines may be achieved through the use of cathode separators (element 302 of FIG. 3b). Typically a number of displays are fabricated on a single substrate and at the end of the fabrication process the substrate is scribed and the displays separated. An encapsulant such as a glass sheet or a metal can is utilized to inhibit oxidation and moisture ingress.

Figure 2:
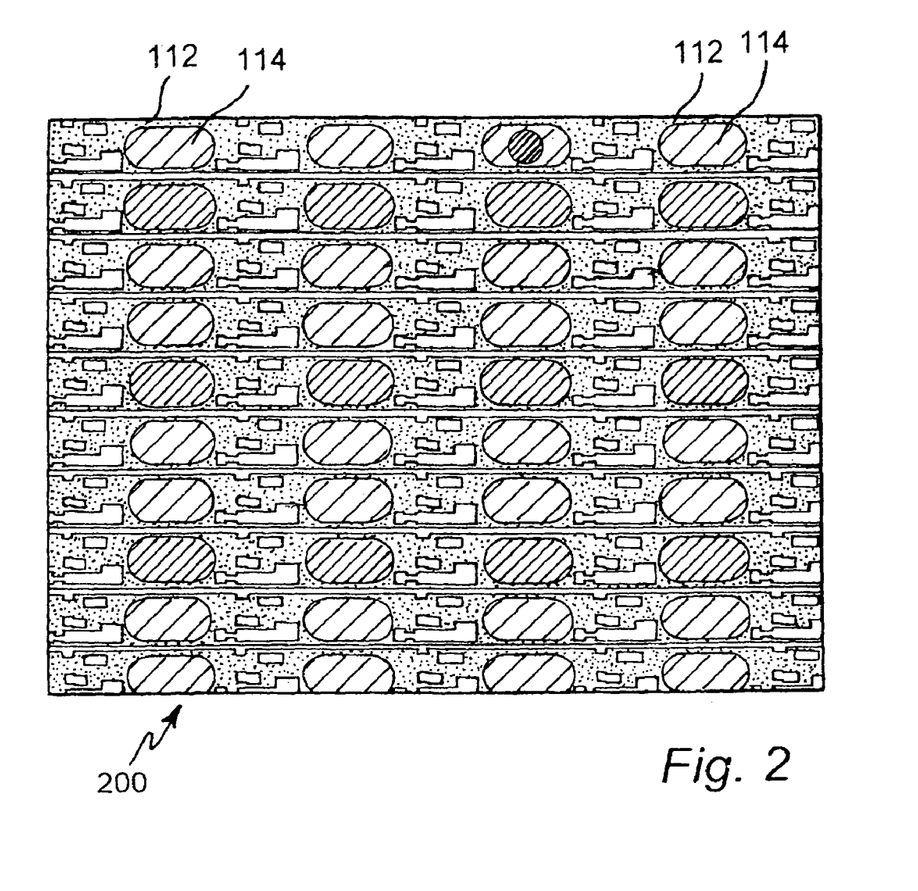
FIG. 2 shows a view from above of a portion of a three color pixelated OLED display.

FIG. 2 shows a view from above (that is, not through the substrate) of a portion of a three color active matrix pixelated OLED display 200 after deposition of one of the active color layers. The figure shows an array of banks 112 and wells 114 defining pixels of the display.

Figure 3A:
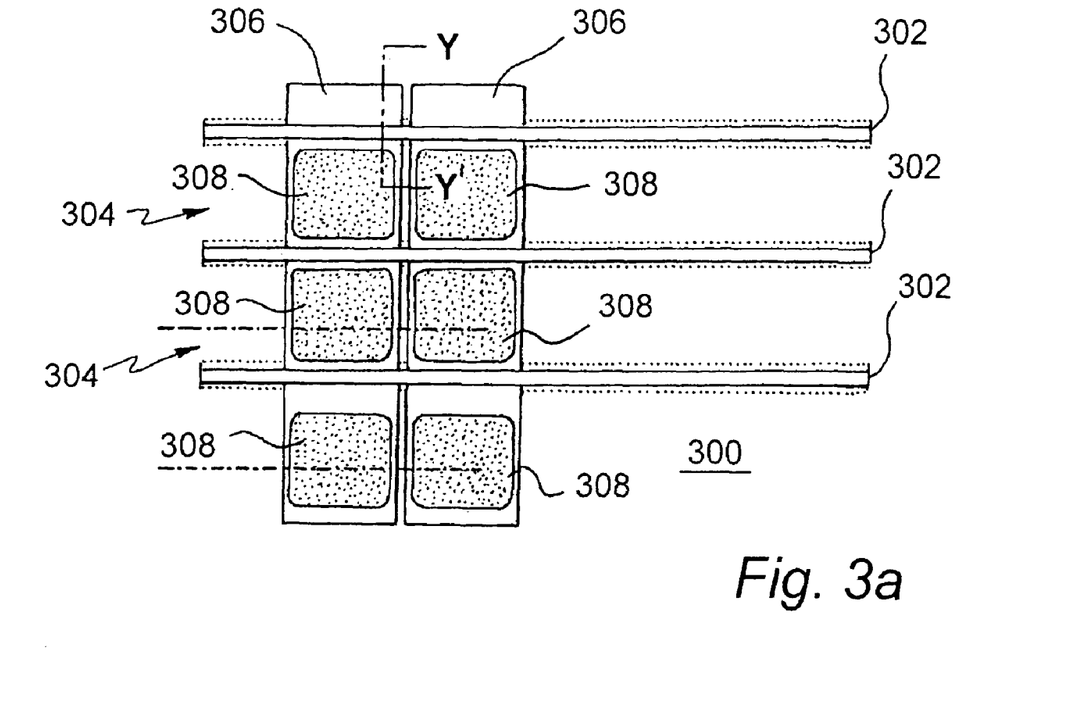
FIGS. 3a and 3b show a view from above and a cross-sectional view respectively of a passive matrix OLED display.
Figure 3B:
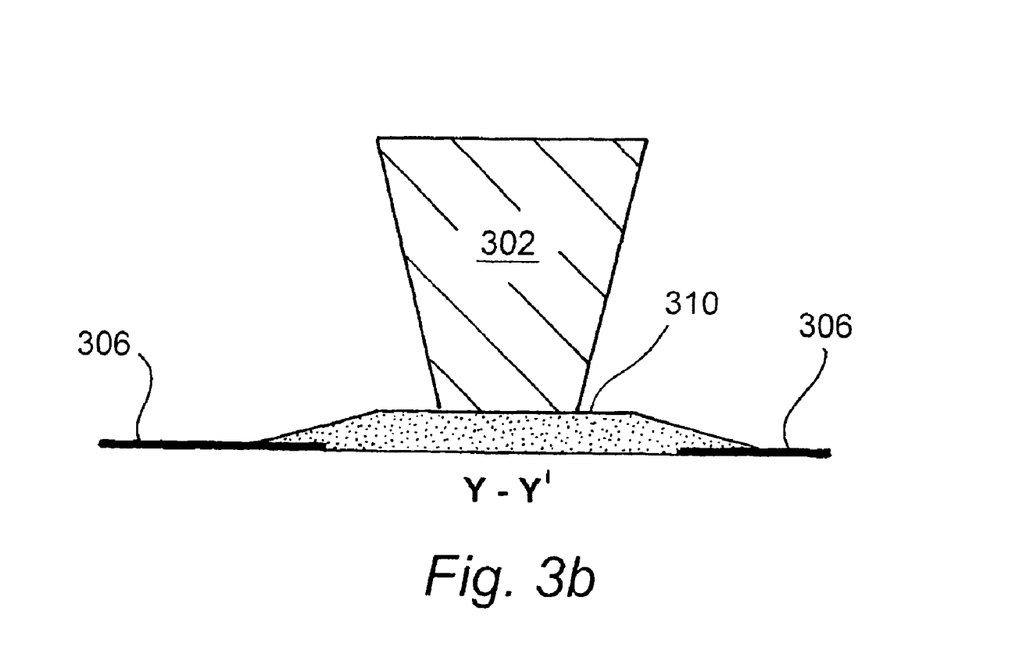

FIG. 3a shows a view from above of a substrate 300 for inkjet printing a passive matrix OLED display. FIG. 3b shows a cross-section through the substrate of FIG. 3a along line Y-Y'.

Referring to FIGS. 3a and 3b, a substrate is provided with a plurality of cathode undercut separators 302 to separate adjacent cathode lines (which will be deposited in regions 304). A plurality of wells 308 are defined by banks 310 constructed around the perimeter of each well 308, and leaving an anode layer 306 exposed at the base of the well. The edges or faces of the banks are tapered onto the surface of the substrate at an angle of between 10 and 40 degrees.

In the example shown, the cathode separators are around 5 µm in height and approximately 20 µm wide. Banks are generally between 20 µm and 100 µm in width and in the example shown have a 4 µm taper at each edge (so that the banks are around 1 µm in height). The pixels of FIG. 3a are approximately 300 µm² but the size of a pixel can vary considerably, depending upon the intended application.

Figure 4A:
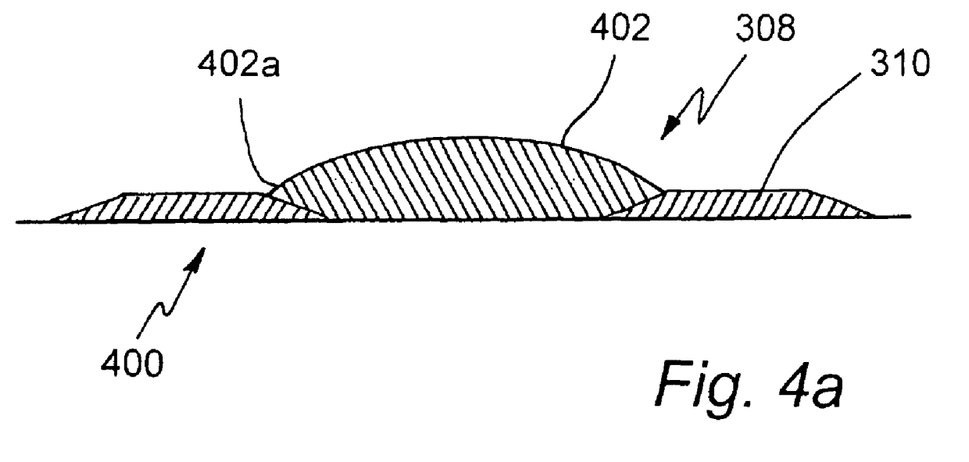
FIGS. 4a and 4b show a simplified cross section of a well of an OLED display substrate filled with, respectively, dissolved material, and dry material.
Figure 4B:
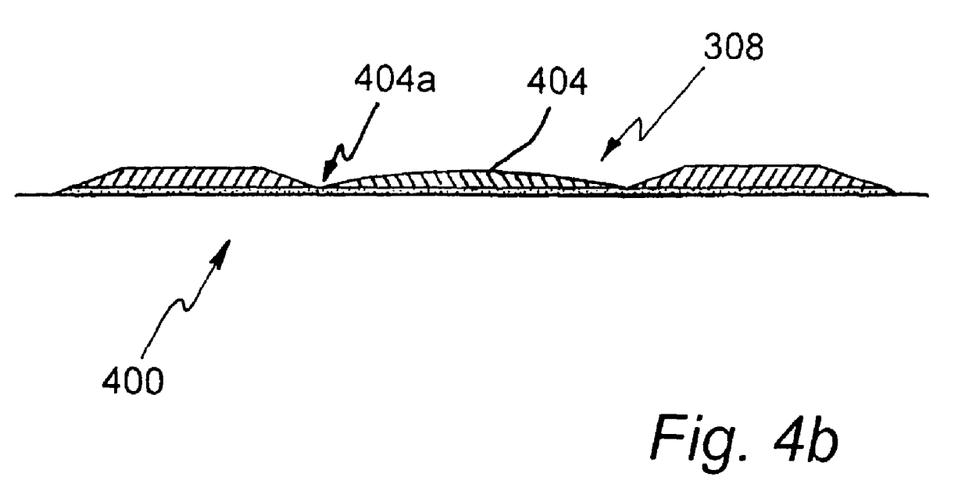

FIG. 4a shows a simplified cross section 400 through a well 308 filled with dissolved material 402, and FIG. 4b shows the same well after the material has dried to form a solid film 404. In this example the bank angle is approximately 15° and the bank height is approximately 1.5 µm. As can be seen a well is generally filled until it is brimming over. The solution 402 has a contact angle $\theta_c$ identified as angle 402a, with the plasma treated bank material of typically between 30° and 40° for example 35°; this is the angle the surface of the dissolved material 402 makes with the (bank) material it contacts. As the solvent evaporates the solution becomes more concentrated and the surface of the solution moves down the tapering face of a bank towards the substrate; pinning of the drying edge can occur at a point between the initially landed wet edge and the foot of the bank (base of the well) on the substrate. The result, shown in FIG. 4b, is that the film of dry material 404 can be very thin, for example of the order of 10 nm or less, in a region 404a wherein it meets the face of a bank. In practice drying is complicated by other effects such as the coffee ring-effect. With this effect because the thickness of solution is less at the edge of a drop than in the center, as the edge dries the concentration of dissolved material there increases. Because the edge tends to be pinned solution then flows from the center of the drop towards the edge to reduce the concentration gradiant. This effect can result in dissolved material tending to be deposited in a ring rather than uniformly. The physics of the interactions of a drying solution with a surface are extremely complicated and a complete theory still awaits development.

As previously mentioned, the bank and separator structures are typically formed from resist material, for example using a positive (or negative) resist for the banks and a negative (or positive) resist for the separators. Both these resists may be based upon polyimide and spin coated onto the substrate.

One problem with the aforementioned arrangement is that of providing adequate containment of the organic material deposited in the wells such that the wells are not flooded. At the same time, it is desirable for the organic material to spread out, or wet, a substantial part of the well so as to provide layers having an even thickness as otherwise the emission profile across the pixel will vary. Providing good organic film formation is critical to providing a high quality display. It has been found that film formation is affected by the composition of the solution of semi-conductive organic material to be deposited (the "ink"), the composition of the bank material, and the structure of the banks.

Having regard to the containment issue, the bank material can be modified to present a hydrophobic surface in order that the banks are not wetted by the solution of deposited organic material and thus assist in containing the deposited material within a well. This is achieved by treatment of a bank material such as polyimide with an $O_2/CF_4$ plasma as disclosed in EP 0 989 778. Alternatively, the plasma treatment step may be avoided by using a fluorinated material such as a fluorinated polyimide as disclosed in WO 03/083960.

However, it has been found that although good containment can be achieved with the aforementioned bank material, the organic material deposited in the wells can dry to form layers of uneven thickness.

One solution to the aforementioned problem is to modify the bank structure (well profile) so as to provide an undercut bank as described in GB-A-0402559.9. However, etching of organic resist material used for the banks can be difficult to control in order to arrive at an accurately formed well profile.

WO 03/065474 suggests that better films can be formed by overfilling the wells and describes the use of very high barriers to allow the wells to hold a large volume of liquid without the liquid overflowing to adjacent wells. However such structures cannot easily be formed by photolithography of the usual organic resist materials used for the banks.

Another problem associated with organic optoelectrical devices, such as those discussed above, is that in the resultant device the organic hole injecting layer can extend beyond the overlying organic semi-conductive layer providing a shorting path between the cathode and the anode at an edge of the well. This problem is exacerbated if the contact angle of the organic hole injecting composition with the bank material is too low.

One solution to the aforementioned problem is to modify the bank structure by, for example, providing a stepped bank structure which increases the length of the shorting path, thus increasing the resistance of the path resulting in less shorting. Such a solution has been proposed by Seiko Epson. However, as stated previously, etching of organic resist material can be difficult to control in order to arrive at an accurate and reproducible well profile.

Another problem with organic devices is that they tend to be sensitive to moisture and oxygen.

In light of this, the substrate preferably has good barrier properties for prevention of ingress of moisture and oxygen into the device. The substrate is commonly glass. However, alternative substrates may be used, in particular where flexibility of device is desirable. For example, the substrate may comprise a plastic as in U.S. Pat. No. 6,268,695 which discloses a substrate of alternating plastic and barrier layers or a laminate of thin glass and plastic as disclosed in EP 0 949 850.

The device is preferably encapsulated with an encapsulant on an opposite side to the substrate in order to prevent ingress of moisture and oxygen. Suitable encapsulants include a sheet of glass, or an airtight container, such as a metal can, as disclosed in, for example, WO 01/19142. These encapsulates are typically adhered to the substrate around the periphery of the device using a resin. Films having suitable barrier properties such as alternating stacks of polymer and dielectric, as disclosed in, for example, WO 01/81649, may also be used. A getter material for absorption of any atmospheric moisture and/or oxygen that may permeate through the substrate or encapsulant may be disposed between the substrate and the encapsulant.

While the aforementioned arrangements provide good protection against ingress of moisture and oxygen through the top and bottom of the device (i.e. through the encapsulant and the substrate in a direction perpendicular to the plane of the device layers) there is still a problem with lateral moisture and oxygen ingress through the sides of the device (i.e. through the sides of the device in a direction parallel to the plane of the device layers). This is particularly problematic at the periphery of the device where electrical connections of the electrodes exit the device for connecting to a power supply. These "exit tracks" usually pass out of the device at an exit region at the periphery of the device between the substrate and encapsulant where the encapsulant is adhered to the substrate.

SUMMARY OF THE INVENTION

The invention provides solving the aforementioned problems associated with bank formation and encapsulation without unduly increasing the processing steps involved in manufacturing a device.

Accordingly, the invention provides an organic optoelectrical device comprising: a substrate; at least one first electrode disposed over the substrate; a layer of bank material disposed over the first electrode and defining a plurality of wells; a layer of organic semi-conductive material disposed in the wells; at least one second electrode disposed over the layer of organic semi-conductive material in the wells; an encapsulant disposed over the at least one second electrode; a layer of the bank material provided at the periphery of the device; and a metallic seal adhering the encapsulant to the layer of bank material at a periphery of the device, the bank material being an inorganic electrically insulating material whereby the substrate, the bank material, the metallic seal and the encapsulant form a seal at the periphery of the device.

According to a second aspect, the invention provides a method of fabricating an organic optoelectrical device comprising: depositing a layer of bank material over a subtrate on which at least one first electrode is disposed; patterning the layer of bank material to define a plurality of wells; depositing a layer of organic semi-conductive material in the wells; depositing at least one second electrode over the layer of organic semi-conductive material in the wells; placing an encapsulant over the at least one second electrode, wherein the step of depositing bank material includes providing a layer of the bank material at a periphery of the device, and a metallic seal is used to adhere the encapsulant to the layer of bank material at the periphery of the device, the bank material being an inorganic electrically insulating material whereby the substrate, the bank material, the metallic seal and the encapsulant form a seal at the periphery of the device.

According to a third aspect, the invention provides an organic optoelectrical device comprising: a substrate; at least one first electrode disposed over the substrate; a layer of bank material disposed over the first electrode and defining a plurality of wells; a layer of organic semi-conductive material disposed in the wells; at least one second electrode disposed over the layer of organic semi-conductive material in the wells; and an encapsulant disposed over the at least one second electrode, the bank material being a fluorinated inorganic electrically insulating material.

BRIEF DESCRIPTION OF THE DRAWINGS

Embodiments of the invention will now be described, by way of example only, with reference to the accompanying drawings in which.

DETAILED DESCRIPTION

The inorganic electrically insulating material used as the bank material moisture barrier and provides a means of producing a truly hermetic barrier when combined with a metallic seal. Furthermore, etching of an inorganic electrically insulating material is more controllable than etching the usual photoresist material such that the wells can be formed with more accurate and reproducible profiles. This allows for more control over film formation for the semi-conductive material deposited in the wells. As a result better semi-conductive films can be formed by, for example, providing an under-cut bank structure. Furthermore, if necessary, more complex bank structures can be realised. For example, in order to prevent the problem of shorting at the periphery of the well, a stepped bank structure may be provided. Alternatively, in order to allow the wells to hold a large volume of liquid without the liquid overflowing to adjacent wells, very high barriers can be provided. The use of the inorganic electrically insulating material allows these structures to be formed more reproducibly and accurately when compared to the organic photoresist material previously used. Furthermore, it is envisaged that other structures for the banks will be accessible using the inorganic electrically insulating material, thereby allowing for further improvements in device performance.

The invention provides the advantages outlined above without unduly increasing the processing steps involved in manufacturing the device by utilizing the same inorganic electrically insulating material to form both the bank structure and the hermetic seal at the periphery of the device. Thus, the bank structure and part of the sealing structure can be formed in a single deposition step in the manufacturing process saving time and cost.

Preferably, the at least one first and second electrodes have electrical connections which pass between the encapsulant and the substrate at an exit region at the periphery of the device, the layer of the bank material at the periphery of the device being provided over the electrical connections at the exit region and the metallic seal adhering the encapsulant to the layer of bank material at the exit region.

With the aforementioned arrangement, a hermetic seal can be realized at the exit region which has been found to be the most likely point of entry for moisture and oxygen in prior devices. Furthermore, as the inorganic electrically insulating material covers the electrical connections at the exit region, it provides insulation between the electrical connections and the metallic seal preventing shorting.

Preferably, the layer of bank material defining the plurality of wells extends outwards to form the layer of bank material at the periphery of the device. A continuous single layer of inorganic electrically insulating material can be deposited and then patterned to form both the bank structure and part of the sealing structure.

Preferably, the bank material comprises a hard dielectric material such as an inorganic oxide, a nitride, or an oxynitride. Examples of suitable materials include silicon based materials such as SiO, $SiO_2$ and $Si_xN_y$. The bank material could be doped. Suitable dopants include phosphorus, arsenic, and boron. Preferably, the concentration of the dopants is in the range 0-10% by weight, more preferably 0-5% by weight. More than one dopant may be provided, e.g. a combination of boron and phosphorus in a borophosphosilicate. Spin on glass (SOG) is a suitable commercially available material comprising a mixture of $SiO_2$ and dopants (either boron or phosphorous) suspended in a solvent solution.

The wetting properties of the bank material can be fine tuned by introducing another material therein which has different wetting properties. For example, the bank material may be a fluorinated dielectric material such as fluorinated $SiO_2$. The inorganic electrically insulating material may be fluorinated by treatment of a bank material with fluorine containing plasma after deposition of the bank material. Alternatively, the plasma treatment step may be avoided by using a fluorinated material. Furthermore, additional treatments to modify the wettability of the bank material include RF etching, plasma cleaning using various gases, or other surface modifying processes.

Preferably, the metallic seal is made of a metallic material with a low melting point, e.g. less than 200° C. A low temperature solder pre-form may be used, for example, a pre-form solder piece, shaped to follow the seal area (i.e. a picture frame). A suitable localized heat source such as laser welding can be used to melt the solder and prevent the device area from heating up. This ensures that the heat is highly localized only in the solder region. Other options for localized welding are available e.g. induction welding or IR. Alternatively, a heated chuck could heat up the whole can, with the solder pre-form in place. This would also have the advantage of activating certain getter materials if found to be necessary. The encapsulant and/or the substrate may require an additional metallised surface to act as a key for the solder pre-form.

The bank material used in the fabricating method of the invention can be deposited using sputtering, evaporation or chemical vapor deposition (CVD) process schemes. High energy evaporation and high density plasma (HDP) processes are particularly advantageous when hermeticity is a key requirement. HDP provides an excellent moisture barrier and provides a means of producing a truly hermetic barrier when combined with a metallic solder seal.

It is particularly advantageous to use a HDP process in the exit region over, and between, the electrical connections. HDP has the ability to fill very narrow sub-half micron gaps and fill featured areas from the bottom up—almost self-planarizing. In contrast, using conventional CVD methods can result in what is known as a "breadloafing" profile when depositing material into small gaps such that the gaps are not completely filled. HDP can be utilized to completely fill in small gaps as well as fill in larger gaps prior to etching. Because the bank material is deposited prior to the organic layers then the use of such high energy deposition processes is possible. In contrast, utilizing high energy deposition processes after deposition of the organic layers leads to damage of the organic layers.

Deposition rate can affect the amount of fluorine incorporated into the deposited layer. The bank material can typically be deposit at 1000 s of Angstroms per minute using HDP. With this deposition rate, it will typically take about a minute to fill the gaps between the conductive exit tracks. In one embodiment, HDP is used to fill the gaps between the conductive exit tracks and then a standard CVD method is used for a final capping layer so as to speed up processing time.

The shape of the inkwells can be determined by patterning and etching of the deposited bank material.

Embodiments of the invention provide inorganic electrically insulating inkwells which are deposited, for example, using HDP, and providing conductor track isolation to allow hermetic sealing with solder. The deposited inorganic electrically insulating film can be used for defining inkwells, covering over conductor tracks, forming internal cathode vias, and providing conductor isolation on the can perimeter prior to carrying out a hermetic solder sealing process. Furthermore, additional features (e.g. resist, polyimide) can be printed and etched to provide containment or cathode separator features.

Glass or metal cans may be used for the encapsulant, with the height of the can set by the solder pre-form giving cost benefits and process simplification.

A very small internal "mop-up" getter may be required, but employing the presently proposed approach can significantly reduce the gettering requirement.

Figure 5:
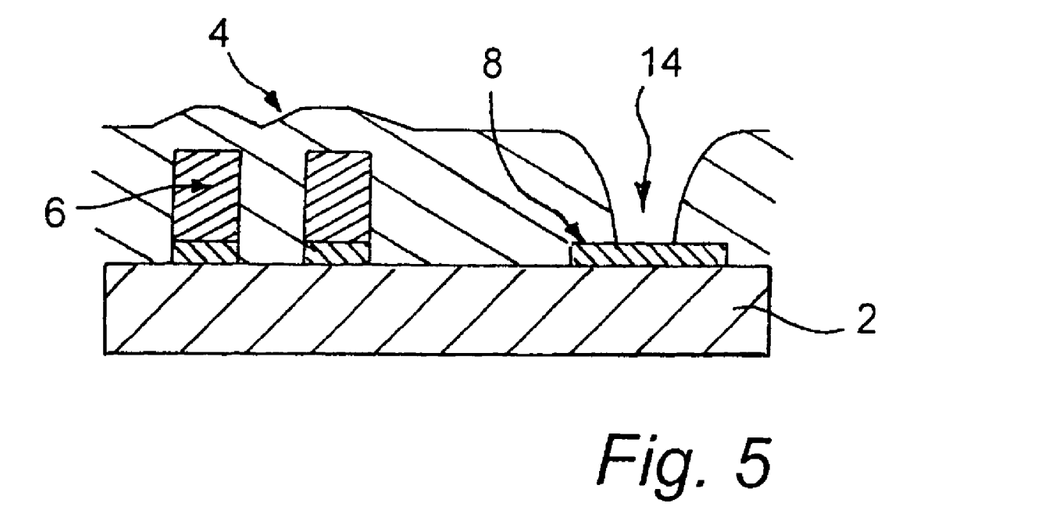
FIG. 5 shows two views of a substrate having an inorganic electrically insulating material deposited thereover covering conductive tracks at an exit region of a device and forming an inkwell in accordance with an embodiment of the invention.
Figure 6:
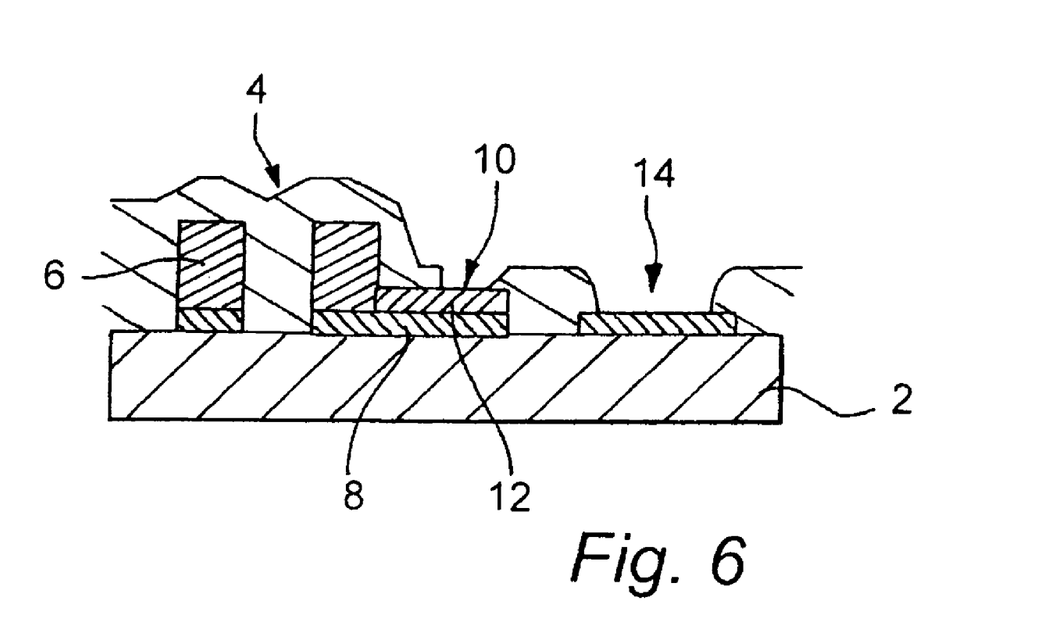
FIG. 6 shows another embodiment of the invention with a cathode connection and an inkwell.

With reference to the drawings, FIG. 5 shows two views of a substrate 2 having an inorganic electrically insulating material 4 deposited thereover covering conductive tracks 6 at an exit region of a device and forming an inkwell in accordance with an embodiment of the invention. The upper view shows active matrix conductive tracks 6 exiting the device seal area. HDP achieves ultra narrow gap filling (between conductive tracks) and simultaneously can fill open areas. The inorganic electrically insulating material 4 electrically isolates the conductive tracks 6 such that a metallic solder seal can be disposed thereon to form a hermetic seal. The lower view shows the conductive tracks 6 (e.g. active matrix conductive tracks) over ITO anodes 8. The inorganic electrically insulating material 4 can be controllably etched to provide features such as cathode connection 10 for the cathode 12 and inkwell 14 as shown in FIG. 6. These features can be formed at the same time. Organic light-emissive material is disposed between the anode 8 and the cathode 12. It is to be noted that the Figures are simplified schematic drawings for illustrative purposes only.

Figure 7:
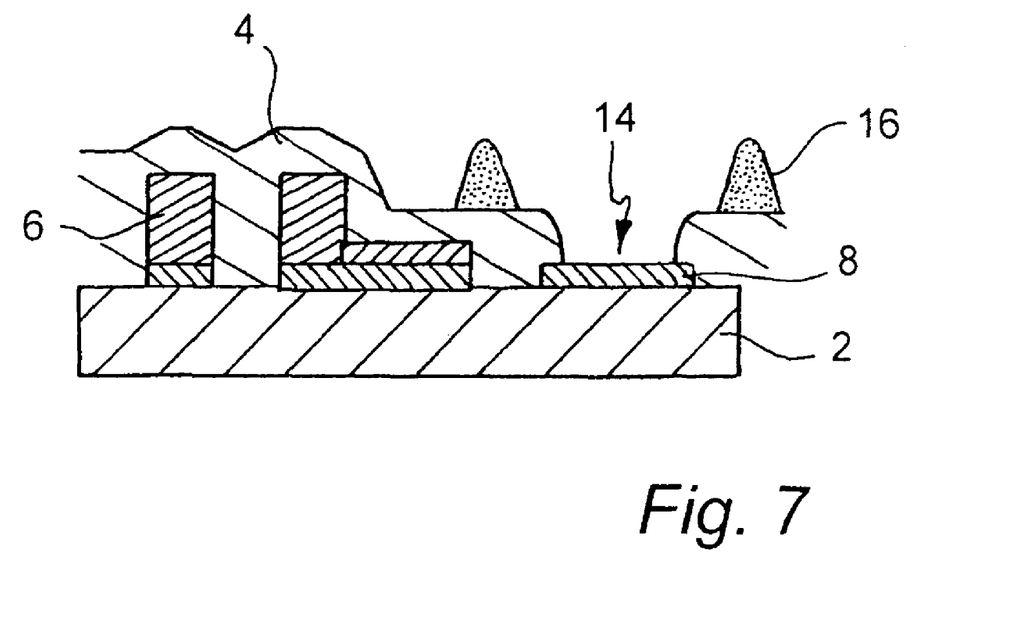
FIG. 7 shows another embodiment of the invention with a "double-bank" inkwell structure.
Figure 8:
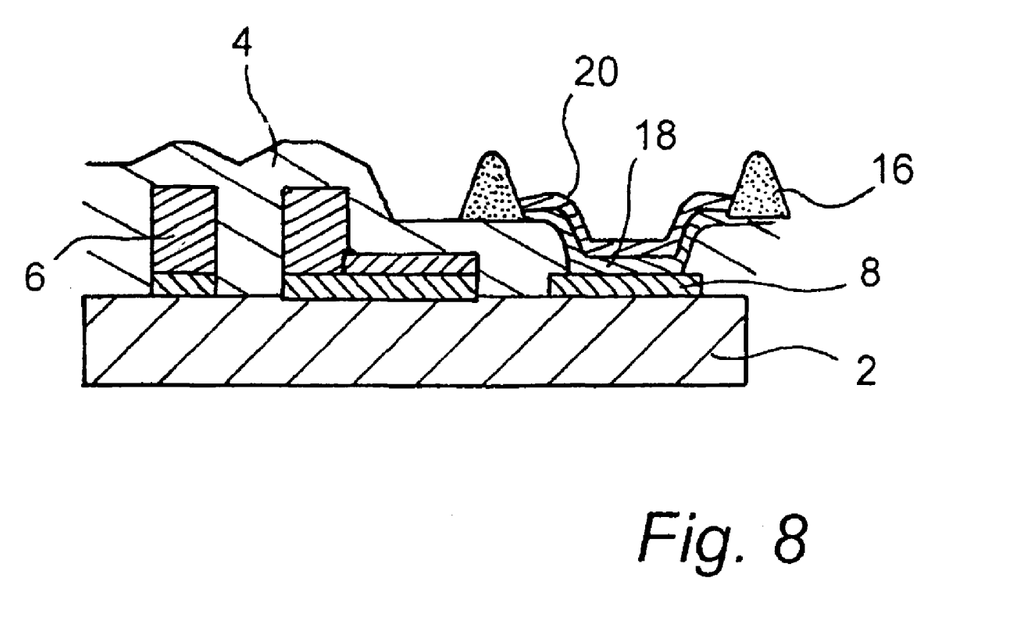
FIG. 8 shows the embodiment of FIG. 7 after deposition of hole injection and light emitting organic layers.

FIG. 7 shows a "double-bank" well structure in accordance with another embodiment of the invention utilizing an $SiO_2$ bank etched to form an inkwell 14 with further resist bank features 16 deposited on either side of the inkwell 14. This structure allows hole transport material 18, such as PEDOT, to wet over the edge of the etched $SiO_2$ —the extent of this determined by its fluorine content and the surface treatment conditions—stopping at the resist bank features 16. A light emitting polymer (LEP) material 20 can then wet over the entire PEDOT surface also up to the resist bank features 16, but wetting up the bank feature sidewall to a different extent than that of the PEDOT. In this way the wetting of the PEDOT and of the LEP are largely decoupled, and so can be optimized somewhat independently, to allow complete coverage of the PEDOT layer 18 by LEP 20.

This is particularly beneficial where the PEDOT and LEP inks have largely different wetting properties onto a common single bank resist material. This is also beneficial where the LEP ink would not normally wet over the edges of the PEDOT to provide an entirely overlapping sandwich due to either high repulsion from the bank, or where a PEDOT material is used that does not generally allow good wetting of LEP thereon.

The invention claimed is:

1. An organic optoelectrical device comprising:
    a substrate;
    at least one first electrode disposed over the substrate;
    a layer of bank material disposed over the first electrode and defining a plurality of wells;
    a layer of organic semi-conductive material disposed in the wells;
    at least one second electrode disposed over the layer of organic semi-conductive material in the wells;
    an encapsulant disposed over the at least one second electrode;
    a layer of the bank material provided at a periphery of the device; and a metallic seal adhering the encapsulant to the layer of bank material at the periphery of the device, the bank material being an inorganic electrically insulating material whereby the substrate, the bank material, the metallic seal, and the encapsulant form a seal at the periphery of the device, wherein the metallic seal is made of a metallic material with a melting point less than 200° C.

2. An organic optoelectrical device according to claim 1, wherein the first and second electrodes have electrical connections which pass between the encapsulant and the substrate at an exit region at the periphery of the device, the layer of the bank material at the periphery of the device being provided over the electrical connections at the exit region and the metallic seal adhering the encapsulant to the layer of bank material at the exit region.

3. An organic optoelectrical device according to claim 1, wherein the layer of bank material defining the plurality of wells extends outwardly to form the layer of bank material at the periphery of the device.

4. An organic optoelectrical device according to claim 1, wherein the bank material comprises an inorganic oxide, inorganic nitride or inorganic oxy-nitride.

5. An organic optoelectrical device according to claim 1, wherein the bank material comprises a silicon based inorganic material.

6. An organic optoelectrical device according to claim 1, wherein the bank material is doped.

7. An organic optoelectrical device according to claim 6, wherein the dopant is at least one selected from the group consisting of phosphorus, arsenic, and boron.

8. An organic optoelectrical device according to claim 6, wherein the dopant is provided at a concentration in the range 0-10% by weight.

9. An organic optoelectrical device according to claim 1, wherein the bank material comprises an additive for modifying wetting properties of the wells.

10. An organic optoelectrical device according to claim 9, wherein the additive is fluorine.

11. A method of fabricating an organic optoelectrical device comprising: depositing a layer of bank material over a substrate on which at least one first electrode is disposed; patterning the layer of bank material to define a plurality of wells; depositing a layer of organic semi-conductive material in the wells; depositing at least one second electrode over the layer of organic semi-conductive material in the wells; and, placing an encapsulant over the at least one second electrode, wherein the step of depositing bank material includes providing a layer of the bank material at a periphery of the device, and adhering the encapsulant to the layer of bank material at the periphery of the device with a metallic seal, the bank material being an inorganic electrically insulating material whereby the substrate, the bank material, the metallic seal and the encapsulant form a seal at the periphery of the device, wherein the metallic seal is made of a metallic material with a melting point less than 200° C.

12. A method according to claim 11, wherein the first and second electrodes have electrical connections which pass between the encapsulant and the substrate at an exit region at the periphery of the device, the layer of the bank material at the periphery of the device being provided over the electrical connections at the exit region and the metallic seal adhering the encapsulant to the layer of bank material at the exit region.

13. A method according to claim 11, comprising depositing the layer of bank material defining the plurality of wells and the layer of bank material at the periphery of the device in a single deposition step.

14. A method according to claim 11, wherein the bank material comprises an inorganic oxide, inorganic nitride, or inorganic oxy-nitride.

15. A method according to claim 11, wherein the bank material comprises a silicon based inorganic material.

16. A method according to claim 11, wherein the bank material is doped.

17. A method according to claim 16, wherein the dopant is at least one selected from the group consisting of phosphorus, arsenic, and boron.

18. A method according to claim 16, comprising providing the dopant at a concentration in the range 0-10% by weight.

19. A method according to claim 11, wherein the bank material comprises an additive for modifying wetting properties of the wells.

20. A method according to claim 19, wherein the additive is fluorine.

21. A method according to claim 19, comprising incorporating the additive by treating the bank material after deposition of the bank material.

22. A method according to claim 21, comprising incorporating the additive by plasma treatment.

23. A method according to claim 11, comprising subjecting the bank material to RF etching or plasma cleaning after depositing and etching.

24. A method according claim 11, comprising depositing the bank material using one of sputtering, evaporation, and chemical vapor deposition.

25. A method according to claim 24, comprising depositing the bank material using a high density plasma (HDP) process.

26. A method according to claim 11, comprising depositing and then patterning a continuous single layer of bank material to form both the inkwells and the layer of the bank material at the periphery of the device for the hermetic seal.

27. A method according to claim 11, comprising using a solder pre-form to form the metallic seal.

28. A method according to claim 27, wherein the solder pre-form is in the shape of a picture frame.

29. A method according to claim 27, comprising providing at least one of the encapsulant and the substrate with a metallized surface to act as a key for the solder pre-form.

30. A method according to claim 27, comprising forming the metallic seal by heating using one of a laser, induction welding, IR, and a heated chuck.

31. A method according to claim 11, comprising initially depositing the bank material using HDP and then applying a capping layer using a CVD method.

32. A method according to claim 11, comprising depositing resist features over the bank material prior to deposition of the cathode.

33. An organic optoelectrical device according to claim 1, wherein the bank material comprises a fluorinated inorganic oxide, fluorinate inorganic nitride, or fluorinate inorganic oxy-nitride.

34. An organic optoelectrical device according to claim 1, wherein the bank material comprises a fluorinated silicon based inorganic material.

35. A method according to claim 11, further comprising subjecting at least a portion of the bank material to a plasma treatment to fluorinate the bank material.

36. An organic optoelectrical device according to claim 1, wherein the encapsulant is a glass or metal can.

37. A method according to claim 11, wherein the encapsulant is a glass or metal can.

* * * * *

UNITED STATES PATENT AND TRADEMARK OFFICE
CERTIFICATE OF CORRECTION

| | | |
|---|---|---|
| PATENT NO. | : 7,906,905 B2 | Page 1 of 1 |
| APPLICATION NO. | : 11/598503 | |
| DATED | : March 15, 2011 | |
| INVENTOR(S) | : Martin Richardson et al. | |

It is certified that error appears in the above-identified patent and that said Letters Patent is hereby corrected as shown below:

In the Specification:

At Column 3, line 35, "gradiant" should be -- gradient --.
At Column 5, line 26, "subtrate" should be -- substrate --.

Signed and Sealed this
Fourteenth Day of February, 2012

David J. Kappos
*Director of the United States Patent and Trademark Office*